United States Patent
Richter et al.

(10) Patent No.: US 8,664,025 B2
(45) Date of Patent: Mar. 4, 2014

(54) SUBSTRATE DICING TECHNIQUE FOR SEPARATING SEMICONDUCTOR DIES WITH REDUCED AREA CONSUMPTION

(75) Inventors: Daniel Richter, Radebeul (DE); Frank Kuechenmeister, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 15 days.

(21) Appl. No.: 13/187,076

(22) Filed: Jul. 20, 2011

(65) Prior Publication Data

US 2012/0049379 A1 Mar. 1, 2012

(30) Foreign Application Priority Data

Aug. 31, 2010 (DE) .................. 10 2010 040 062

(51) Int. Cl.
*H01L 23/48* (2006.01)

(52) U.S. Cl.
USPC ............... 438/33; 438/68; 438/113; 438/458; 438/460; 438/462; 438/464; 438/465

(58) Field of Classification Search
USPC ............. 438/33, 68, 113, 458, 460, 462, 464, 438/465
See application file for complete search history.

(56) References Cited

U.S. PATENT DOCUMENTS

| 5,128,282 | A | 7/1992 | Ormond et al. |
| 5,284,792 | A * | 2/1994 | Forster et al. ............... 438/29 |
| 6,955,947 | B2 | 10/2005 | Dias et al. |
| 7,674,689 | B2 | 3/2010 | Schneegans et al. |
| 2004/0235272 | A1 * | 11/2004 | Howard et al. ............. 438/462 |

FOREIGN PATENT DOCUMENTS

| DE | 10116791 A1 | 12/2001 |
| WO | 03/030271 A2 | 4/2003 |

OTHER PUBLICATIONS

Translation of Official Communication from German Patent Application No. 10 2010 040 062.9 dated Jun. 16, 2011.

* cited by examiner

*Primary Examiner* — Ha Tran T Nguyen
*Assistant Examiner* — Suberr Chi
(74) *Attorney, Agent, or Firm* — Amerson Law Firm, PLLC

(57) ABSTRACT

The width of scribe lines may be reduced in semiconductor devices by applying a process technique in which trenches may be formed first from the rear side on the basis of a required width of the corresponding trenches, while subsequently it may be cut into the substrate from the front side on the basis of a reduced thickness of the corresponding saw blades, thereby also enabling a reduction of the scribe line width. Furthermore, contamination of the front side, i.e., of the metallization system, may be reduced, for instance, by performing an optional intermediate cleaning process.

14 Claims, 8 Drawing Sheets

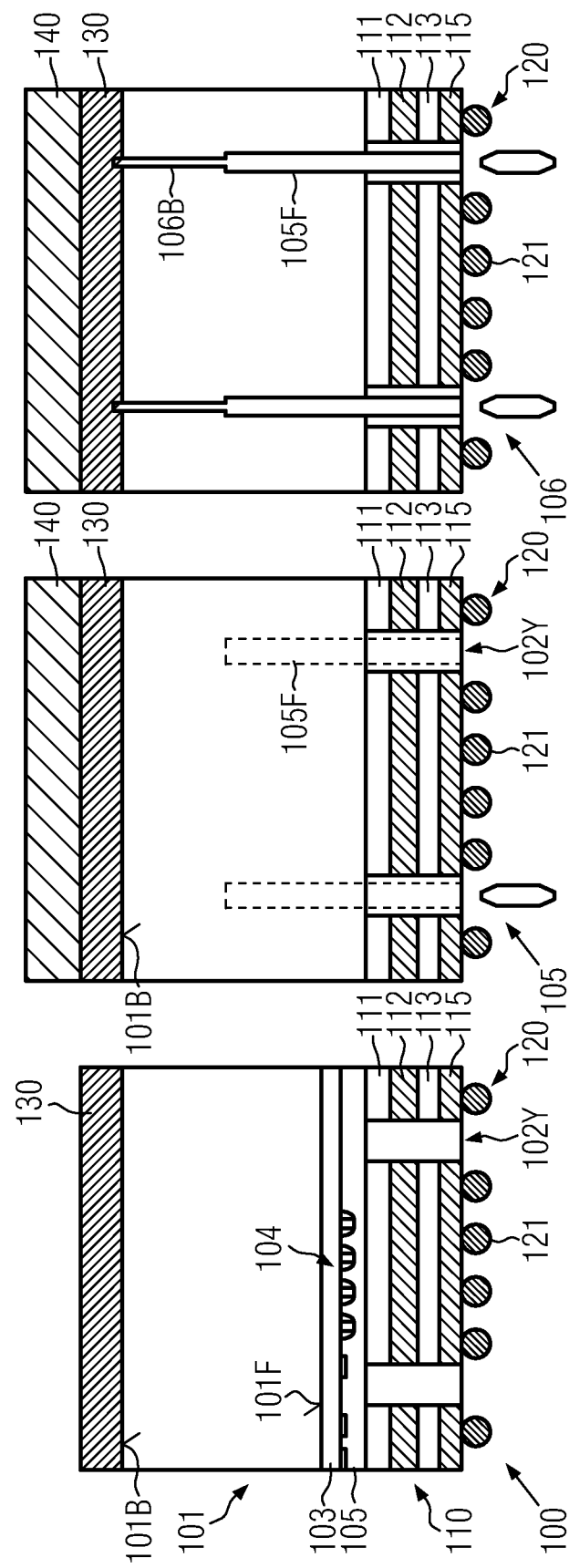

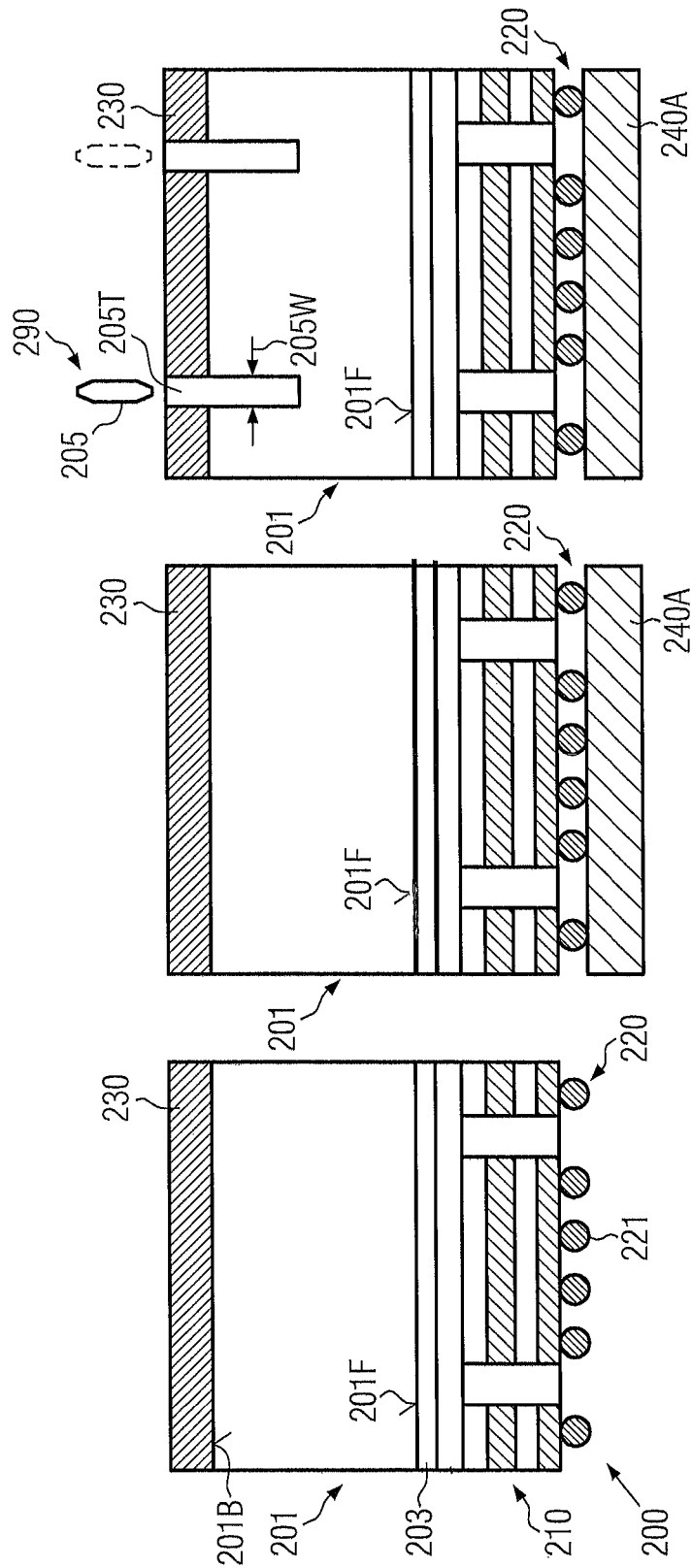

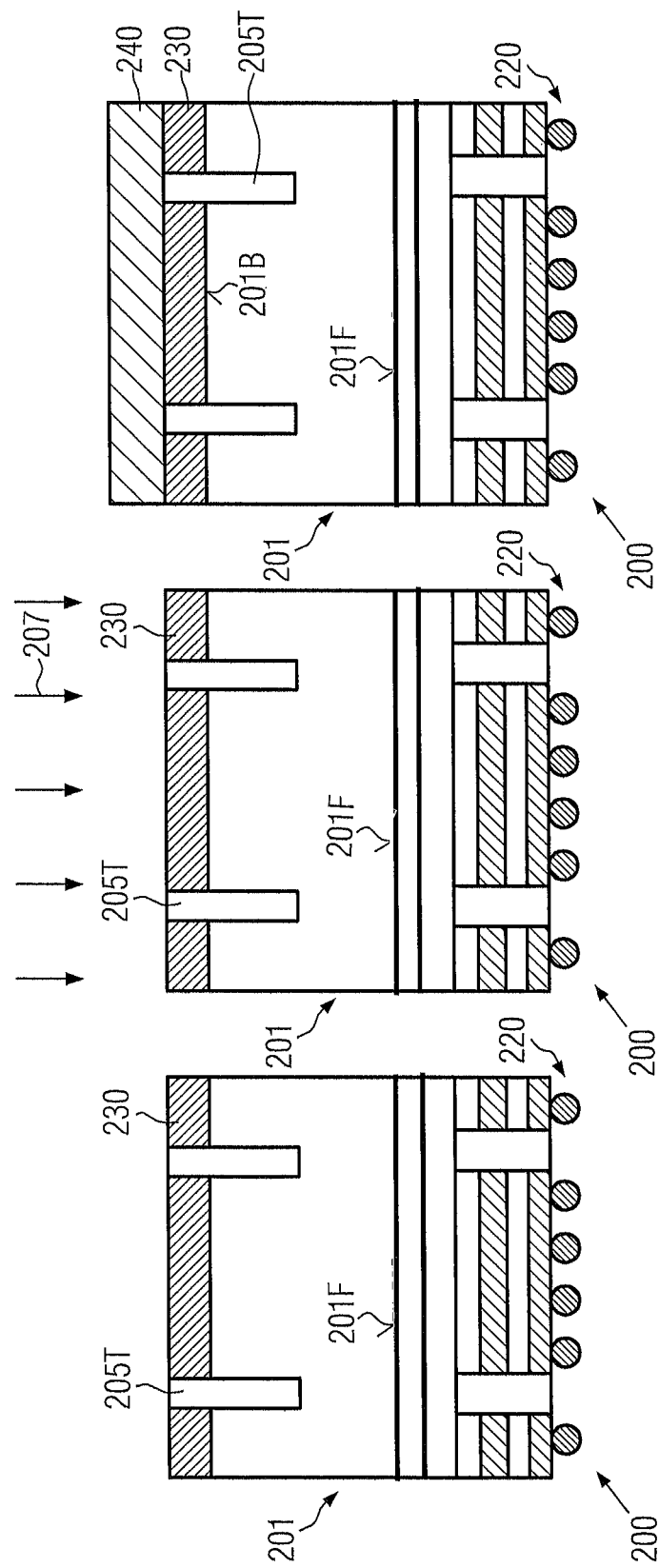

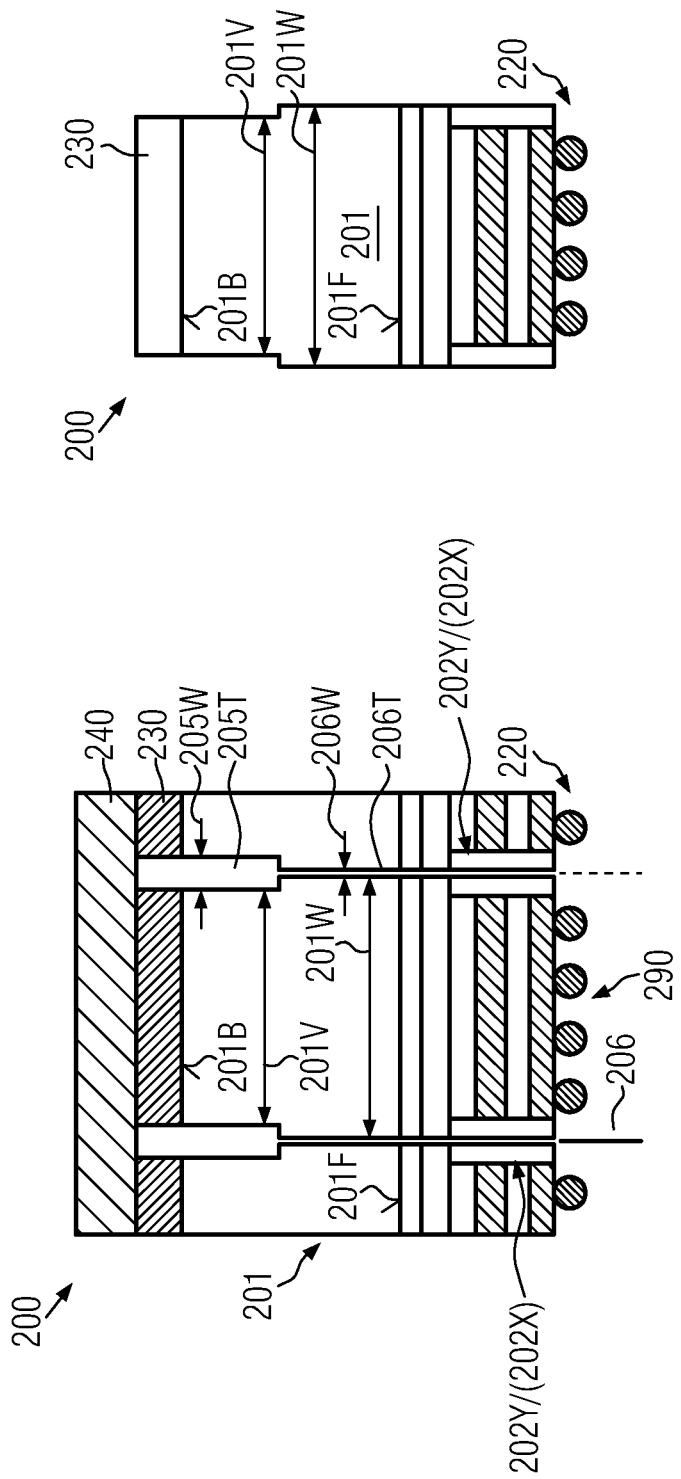

SUBSTRATE DICING TECHNIQUE FOR SEPARATING SEMICONDUCTOR DIES WITH REDUCED AREA CONSUMPTION

BACKGROUND OF THE INVENTION

1. Field of the Invention

Generally, the present disclosure relates to microstructure devices, such as integrated circuits, and, more particularly, to the techniques for dicing substrates so as to provide the individual devices.

2. Description of the Related Art

Semiconductor devices are typically formed on substantially disc-shaped substrates made of any appropriate material. The majority of semiconductor devices including highly complex electronic circuits are currently, and in the foreseeable future will be, manufactured on the basis of silicon, thereby rendering silicon substrates and silicon-containing substrates, such as silicon-on-insulator (SOI) substrates, viable base materials for forming semiconductor devices, such as microprocessors, SRAMs, ASICs (application specific ICs), systems on chip (SoC) and the like. The individual integrated circuits are arranged in an array on the wafer, wherein most of the manufacturing steps, which may involve several hundred and more individual process steps in sophisticated integrated circuits, are performed simultaneously for all chip areas on the substrate, except for photolithography processes, metrology processes and packaging of the individual devices after dicing the semiconductor substrate. Thus, economic constraints drive semiconductor manufacturers to steadily increase the substrate dimensions, thereby also increasing the area available for producing actual semiconductor devices and thus increasing production yield.

In addition to increasing the substrate area, it is also important to optimize the utilization of the substrate area for a given substrate size so as to actually use as much substrate area as possible for semiconductor devices and/or test structures that may be used for process control. In an attempt to maximize the useful surface area for a given substrate size, the feature sizes of circuit elements are steadily scaled down. Due to this ongoing demand for shrinking the feature sizes of highly sophisticated semiconductor devices, copper, in combination with low-k dielectric materials, has become a frequently used alternative in the formation of so-called interconnect structures, comprising metal line layers and intermediate via layers that include metal lines as intra-layer connections and vias as inter-layer connections, which commonly connect individual circuit elements to provide the required functionality of the integrated circuit. Typically, a plurality of metal line layers and via layers stacked on top of each other is necessary to realize the connections between all internal circuit elements and I/O (input/output), power and ground pads of the circuit design under consideration.

In sophisticated semiconductor devices, the continuous shrinkage of the critical dimensions of transistors, and thus of metal features, not only provides superior performance with respect to operating speed but also results in a significant increased power consumption, thereby requiring superior heat dissipation capabilities of the semiconductor devices and the corresponding package substrates. Typically, the metallization system of the semiconductor device is formed in close proximity to the semiconductor-based circuit elements, such as fast switching transistors and the like, and provides, in addition to the electrical contact to the semiconductor-based circuit elements, also an efficient thermally conductive path in order to dissipate the waste heat created within the device level into the metallization system and finally to the package substrate, which in turn may be connected to an external heatsink, if required. Due to the increasing complexity of the metallization system in sophisticated semiconductor devices, however, the number of stacked metallization layers may have to be increased, while at the same time sophisticated dielectric materials, such as low-k dielectric materials and ultra low-k (ULK) materials, are increasingly used in order to reduce the parasitic capacitance, thereby improving the overall electrical performance. On the other hand, the thermal performance, i.e., the heat dissipation capability, of such complex metallization systems may be significantly reduced since typically the low-k dielectric materials and the ULK materials have a significantly reduced heat conductivity compared to conventional dielectric materials, such as silicon dioxide, silicon nitride and the like. Thus, the thermal resistance of complex metallization systems may increase, while at the same time the amount of waste heat created in the device level, i.e., in the semiconductor-based circuit elements, may also increase, thereby requiring additional heat dissipation capabilities in complex semiconductor devices. To this end, frequently the substrate material of the semiconductor device, typically provided in the form of a silicon material, may be used for transferring heat to the periphery of the semiconductor device. That is, the substrate material may have a moderately high thermal conductivity and is also in close proximity to the heat-producing semiconductor circuit elements, so that an efficient heat dissipation path is established from the active semiconductor material into the depth of the substrate. For this reason, frequently the rear side or back side of the substrate may receive an appropriate heat transfer material so as to efficiently connect to the package substrate, wherein well-established metal-based materials, such as indium and the like, are used as a thermal interfacial material due to superior heat conductivity. In other cases, gallium, silver, copper and the like may also be efficiently used as thermal interfacial materials. Due to the material characteristics, such as diffusion behavior, adhesion to specific materials, such as silicon and the like, the thermal interfacial material is typically not directly formed on the substrate back side but requires additional material layers in order to obtain the desired thermal, mechanical or chemical behavior for the coupling between the substrate back side and a package. For this purpose, an adhesion layer is frequently formed on the surface of the substrate back side in order to provide adhesion of the following materials to the semiconductor material of the substrate. For instance, aluminum, aluminum alloys, titanium, titanium nitride, tantalum, tantalum nitride and tantalum silicide are materials that are frequently used as an adhesion material. Thereafter, a barrier material, such as titanium, tantalum, tantalum nitride, tantalum silicide, nickel, chromium and the like, is provided in order to prevent the diffusion of indium, i.e., of the thermal interfacial material into the material of the substrate, such as the silicon material and the like. In addition to these material layers, also one or more layers are provided so as to act as an adhesion layer appropriately attaching the thermal interfacial material to the back side metallization stack and thus to the semiconductor substrate. For this purpose, materials consisting of gold, gold alloys, platinum, gold/platinum alloys, copper, silver and the like are frequently used. Consequently, a moderately complex metallization layer stack is frequently to be formed on the back side or rear side of the semiconductor substrate, wherein a plurality of different materials have to be deposited, at least some of which may have a negative effect on the semiconductor devices and process techniques so that, in view of preventing any cross-contamination, the back side metallization is typically provided in a very advanced manufacturing stage. It turns out, however, that the presence of the back side metallization may still negatively affect the further processing, in particular in the context of complex metallization systems comprising a contact structure as a final part of the metallization system in order to directly connect to a package substrate, particularly during the process of dicing the semiconductor substrate so as to provide the individual semiconductor chips.

FIG. 1a schematically illustrates a top view of a semiconductor substrate 101 wherein a plurality of semiconductor devices 100 are formed above a front side 101F of the substrate 101. The semiconductor devices 100 in this manufacturing stage may be under-stood as die regions, i.e., portions of the substrate 101, in and above which one or more integrated circuit portions, possibly in combination with micromechanical, optical and other devices, are formed in accordance with a specified overall circuit layout. Thus, the semiconductor devices 100 may have a specific size and shape corresponding to the complexity of the one or more integrated circuit portions and other microstructural devices formed therein. As previously indicated, the semiconductor devices or dies 100 are provided in an array form on and above the front side 101F, wherein the number of semiconductor dies 100 that may be positioned on the substrate 101 depends on the overall size of the substrate 101, the size and shape of the semiconductor dies 100 and on the size of corresponding "frame" regions or scribe lines, which determine the lateral distance between any next neighbors of the semiconductor dies 100. For example, in the example shown in FIG. 1a, vertical frame regions or scribe lines, indicated by 102Y, are provided with substantially the same width as horizontal scribe lines 102X. It should be appreciated, however, that the width of the scribe lines 102X, 102Y may be different, as long as process-specific requirements are met by the scribe lines 102X, 102Y. For example, the width of these scribe lines has to at least take into consideration the space required for dicing, i.e., sawing, the substrate 101 into individual semiconductor chips, each of which may thus comprise a single one of the semiconductor devices 100. For example, the width of the scribe lines 102X, 102Y is selected so as to be greater than a thickness of a corresponding saw blade used for sawing the substrate 101 in an advanced manufacturing stage.

FIG. 1b schematically illustrates a cross-sectional view of the substrate 101 comprising the plurality of semiconductor dies 100. As illustrated, each of the semiconductor dies 100 may comprise a semiconductor layer 103 formed above or on the front side 101F of the substrate 101, wherein, in and above the semiconductor layer 103, a plurality of circuit elements 104, such as transistors, capacitors, resistors and the like, are provided in accordance with the overall layout of the one or more circuits provided in the semiconductor dies 100. For example, the circuit elements 104 may comprise circuit elements formed on the basis of critical dimensions of 50 nm and less in sophisticated applications. In other cases, significantly greater critical dimensions may be used when semiconductor devices of reduced packing density in the semiconductor layer 103 are considered. Furthermore, each of the semiconductor dies 100 comprises a contact level 105, which is to be understood as a dielectric material in combination with appropriate contact plugs or elements (not shown) so as to connect to the circuit elements 104 and also connect to a metallization system 110 formed above the contact level 105. The metallization system 110 typically comprises a plurality of metallization layers 111, 112, 113, 115, wherein the number of metallization layers depends on the overall complexity of the layout in and above the semiconductor layer 103, as is also previously discussed. In sophisticated applications, the metallization system 110 may comprise, at least in some critical metallization layers, sensitive dielectric materials, which may result in an inferior heat dissipation capability, as is also discussed above. Moreover, in some complex semiconductor devices, the metallization system 110 may comprise a contact structure 120, which is appropriately configured so as to allow a direct contact to a package substrate, which has formed thereon a "complementary" contact structure, for instance in the form of solder pads and the like, thereby allowing a direct connection of corresponding contact elements 121, such as solder balls, metal pillars and the like, with the package substrate. Consequently, in a correspondingly configured contact structure 120, substantially the entire surface area of each of the semiconductor dies 100 is available for providing contact elements 121 thereon, so that a large number of electrical connections to the periphery may be established, as is typically required in very complex semiconductor devices including complex control circuitry, such as CPUs, GPUs and the like. Depending on the required number of contact elements 121, the lateral pitch of the contact elements 121 is selected so as to comply with the electrical requirements. For example, the lateral size of the contact elements 121 may be on the order of magnitude of 200 μm and less, while a pitch thereof may also be on the same order of magnitude.

In other semiconductor devices, the contact structure 120 may have formed thereon appropriate bond pads (not shown), which are typically provided at the edge of the semiconductor dies 100 in order to enable a wire bonding contact regime after separating the individual semiconductor dies 100.

Furthermore, as discussed above, in sophisticated applications, the semiconductor dies 100 and thus the substrate 101 has formed on a back side or rear side 101B thereof a back side metallization 130, which typically comprises a plurality of individual metal-containing material layers, as discussed above. In this manner, an additional efficient path for heat dissipation is provided from the semiconductor layer 103 to the periphery via the substrate material 101 and the back side metallization 130.

The semiconductor dies 100 as illustrated in FIGS. 1a and 1b may be formed on the basis of any appropriate process strategy. That is, the circuit elements 104 are formed in and above the semiconductor layer 103 by any appropriate process technique, wherein also, in certain cases, circuit elements or portions thereof may be formed within the substrate material 101. Next, the contact level 105 is provided by depositing an appropriate dielectric material and forming conductive elements therein so as to connect to the circuit elements 104. Thereafter, the metallization layers 111, 112, 113, 115 are formed in accordance with any process strategy in order to obtain the desired electrical performance, for instance in terms of current drive capability, parasitic RC (resistance/capacitance) time constants and the like. Finally, the contact structure 120 is formed by providing appropriate solder bumps, metal pillars, bond pads and the like, depending on the complexity of the contact structure and generally of the devices 100 and depending on the desired contact technology to be used for attaching the semiconductor dies 100 to a package substrate or any other carrier material. As discussed above, in a very advanced manufacturing stage, the back side metallization 130 may be provided, for instance, by depositing a plurality of appropriate material layers, as described above. The devices 100 formed on the substrate 101 as shown in FIG. 1b may thus be in an appropriate manufacturing stage for separating the individual semiconductor dies 100.

FIG. 1c schematically illustrates the substrate 101 and the plurality of semiconductor dies 100 in a further advanced manufacturing stage. The separation of the plurality of semiconductor dies 100 is typically accomplished on the basis of a mechanical sawing process in which a diamond blade is used to cut through the substrate 101 and through the metallization system 110 and, if provided, through the back side metallization 130. Due to the increase of the substrate dimensions in order to increase the number of individual semiconductor dies 100 per substrate in view of superior productivity, however, also the thickness of the substrate 101 has to be appropriately adapted in view of mechanical stability and the like. For example, for a diameter of 200-300 mm, which is a frequently used standard in semiconductor facilities, the substrate 101 may have a thickness of approximately 700 μm and more. The scribe lines, for instance the scribe line 102Y as shown in FIG. 1c, is thus appropriately adapted in its width so as to allow a reliable cutting process on the basis of a diamond blade, wherein, however, a thickness thereof may not be arbitrarily reduced since in this case increased chippage may occur and thus reduce the overall production yield upon dicing substrates having the thickness of several hundred micrometers. Moreover, using a thin sawing blade would significantly reduce lifetime of the blade when sawing through the entire thickness of the substrate 101. Consequently, in conventional strategies, a two-step dicing process may typically be applied in which a sawing blade 105 of appropriate thickness is selected so as to cut into the substrate 101 and through the metallization system 110, i.e., the corresponding areas thereof corresponding to the scribe lines 102Y and 102X (FIG. 1a), thereby forming trenches 105F which extend into the depth of the substrate 101. For example, the trenches 105F may be formed so as to extend to approximately half the thickness of the substrate 101. To this end, a tape 140 is provided at the back side, i.e., the back side metallization 130, if provided, or the rear side 101B of the substrate 101.

FIG. 1d schematically illustrates the substrate 101 and the plurality of semiconductor dies 100 in a further advanced manufacturing stage. In this stage, a further sawing process is performed on the basis of a sawing blade 106 having a reduced thickness in order to form further trenches 106B through the previously provided wider trenches 105F. Consequently, the substrate 101 may be separated into individual semiconductor chips by using the sawing blade 106 and forming the trenches 106B, wherein the tape 140 still provides the required mechanical stability of the separated semiconductor chips.

FIG. 1e schematically illustrates a further advanced manufacturing stage. As illustrated, a plurality of individual semiconductor chips, which are also referred to with the reference sign 100, are provided after picking the separated devices from the tape 140 (FIG. 1d). In semiconductor chips such as the chip 100 in which the back side metallization 130 is provided, the cutting process may result in the creation of a certain amount of metal debris, which may migrate to the front side and finally to the metallization system 110.

FIG. 1f schematically illustrates a cross-sectional view of one of the semiconductor chips 100, wherein metal residues 131, created during the cutting through the back side metallization 130, may finally reach the metallization system 110 and thus the contact structure 120. In particular, since the closely spaced contact elements 121 are provided in the structure 120, the metal residues 131 may result in a high probability of creating short circuits, thereby contributing to significant yield losses during the further processing, i.e., during the connection of the semiconductor chip 100 to a package substrate.

Consequently, the conventional technique for separating semiconductor substrates into individual semiconductor chips requires scribe lines of appropriate width so as to comply with a required thickness of the sawing blade, while at the same time significant yield losses may be observed in complex semiconductor devices in which a back side metallization is to be provided. In this case, in some conventional approaches, it has been proposed to apply a back side patterning strategy in which the back side metallization may be patterned so as to obtain scribe lines in order to reduce the probability of creating metal debris. In this case, however, complex lithography and etch processes may have to be performed in a very advanced manufacturing stage at the rear side of the substrate, thereby significantly contributing to overall process complexity and thus production costs.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which semiconductor substrates may be separated into individual semiconductor chips in such a manner that a reduced width of scribe lines may be applied and/or the probability of contaminating the front side of the substrate by any materials provided at the rear side thereof may be reduced. For example, in some illustrative embodiments disclosed herein, the probability of causing metal contamination of a contact structure caused by metal residues of a back side metallization may be significantly reduced, thereby providing superior production yield when forming complex semiconductor devices. To this end, a two-step separation process may be performed in which trenches may be formed from the rear side of the substrate, for instance by using an appropriate sawing blade and the like, and subsequently the semiconductor substrate may finally be separated by forming trenches from the front side thereof, wherein these front side trenches may have a reduced thickness compared to the trenches formed in the rear side. Thus, in illustrative embodiments, sawing blades of different thickness may be applied, wherein, however, the scribe lines may be provided with reduced thickness, since a sawing blade of a reduced thickness may be applied so as to cut into the substrate from the front side. Hence, for a given lateral size of semiconductor dies, an increased number of dies may be provided on a substrate of given diameter, while at the same time, if a back side metallization has to be provided, the probability of creating additional yield losses caused by metal debris may also be reduced.

One illustrative semiconductor device disclosed herein comprises a semiconductor chip comprising a substrate that has a front side and a rear side. The front side defines a front side width and a front side length of the semiconductor chip. Similarly, the rear side of the substrate defines a rear side width and a rear side length. Moreover, the front side width is greater than the rear side width. The semiconductor device further comprises a metallization system formed above the front side of the substrate and comprising a contact structure.

Additionally, the semiconductor device comprises a package substrate that is electrically connected to the contact structure.

One illustrative method disclosed herein relates to separating a substrate comprising an array of semiconductor dies formed above a front side of the substrate. The method comprises sawing into the substrate from a rear side thereof by using a first saw blade having a first thickness so as to form trenches. The method further comprises sawing into the substrate from a front side thereof by using a second saw blade having a second thickness so as to connect to the trenches, wherein the second thickness is less than the first thickness.

A further illustrative method disclosed herein comprises forming an array of semiconductor dies above a front side of a substrate. The method further comprises separating the array into individual semiconductor chips by forming first trenches in a rear side of the substrate, wherein the trenches have a first width. Moreover, the separation of the array comprises the subsequent formation of second trenches with a second width in the front side so as to connect to the first trenches, wherein the second width is less than the first width. The method additionally comprises attaching a package substrate to each of at least some of the individual semiconductor chips.

BRIEF DESCRIPTION OF THE DRAWINGS

The disclosure may be understood by reference to the following description taken in conjunction with the accompanying drawings, in which like reference numerals identify like elements, and in which:

FIGS. 1b-1d schematically illustrate cross-sectional views of the conventional substrate during a process sequence for separating the semiconductor substrate into individual semiconductor chips;

Figure 1A:
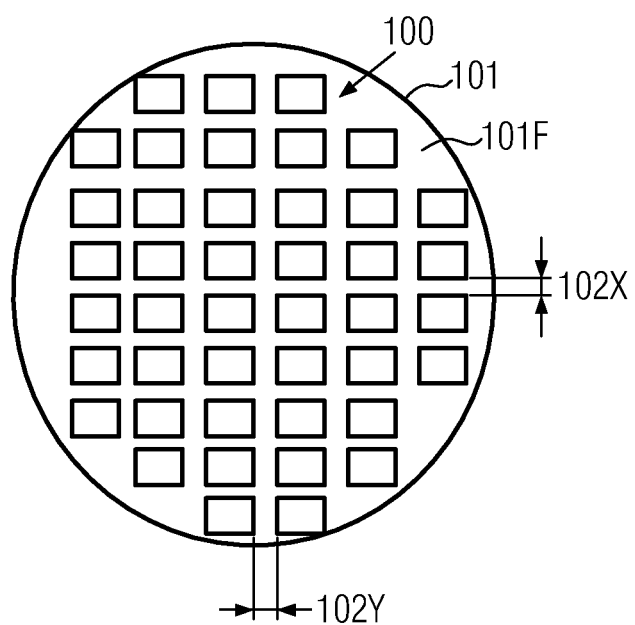
FIG. 1a schematically illustrates a top view of a substrate comprising a plurality of semiconductor dies arranged in an array form comprising scribe lines, in accordance with conventional strategies.
Figure 1F:
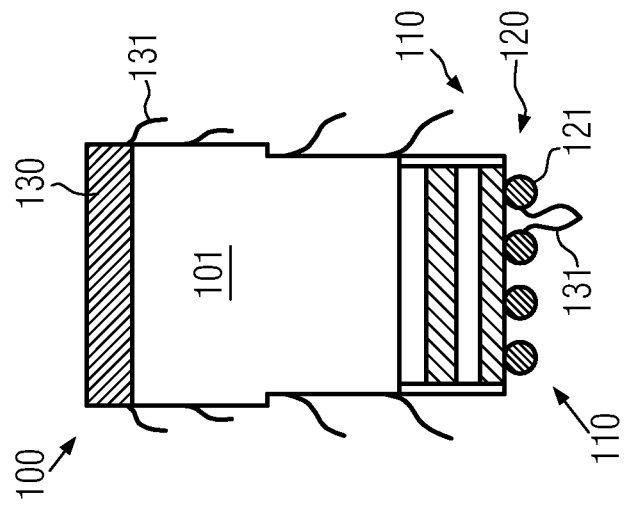
FIGS. 1e-1f schematically illustrate cross-sectional views of a separated semiconductor chip in which a high probability exists for contaminating the metallization system by metal residues of a back side metallization, according to conventional techniques.
Figure 1E:
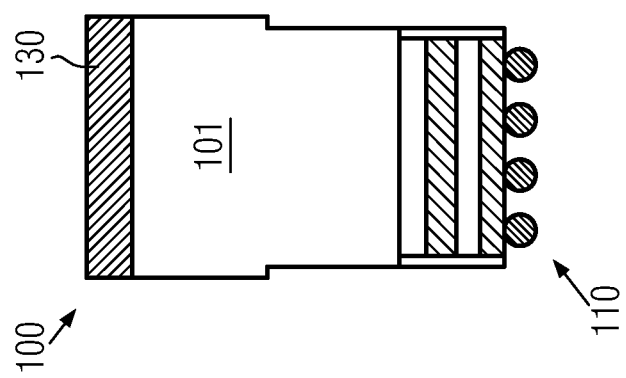

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides semiconductor devices and manufacturing techniques in which a very space-efficient separation process may be provided by forming trenches of appropriate width from a rear side of the substrate and completely separating the substrate by forming trenches of reduced width from a front side thereof, which may be accomplished on the basis of sawing blades of different thickness and the like. In this manner, scribe lines on the front side of the substrate may be provided with reduced width, which allows arranging an increased number of semiconductor dies for a given size of the substrate and a given size and shape of the semiconductor dies. Moreover, in sophisticated applications in which the provision of a back side metallization is required, the probability of creating any contamination at the front side during the dicing process may be significantly reduced since the back side metallization may be cut without direct access to the front side, thereby reducing the probability of the migration of metal residues from the back side to the front side. In some illustrative embodiments, an additional cleaning process may be applied after cutting through the back side metallization, thereby even further reducing the probability of contaminating the front side during the further processing.

With reference to FIGS. 2a-2k, further illustrative embodiments will now be described in more detail, wherein reference may also be made to FIGS. 1a-1f, if appropriate.

FIG. 2a schematically illustrates a cross-sectional view of a plurality of semiconductor dies 200 formed above the front side 201F of a substrate 201. The semiconductor dies 200 may comprise a semiconductor layer 203, in and above which may be provided circuit elements, such as transistors, resistors and the like. Moreover, a metallization system 210 may be provided above the semiconductor layer 203 and may have any appropriate configuration in terms of the number of metallization layers, the material compositions of dielectrics and metal-containing materials and the like. Moreover, the metallization system 210 may comprise a contact structure 220 in order to electrically connect each of the semiconductor dies 200 with a corresponding package substrate or carrier substrate in a later manufacturing stage. For example, the contact structure 220 may comprise contact elements 221 such as solder balls, metal pillars, bond pads and the like.

It should be appreciated that, with respect to any components described so far, the same criteria may apply as previously discussed with reference to the substrate 101 and the semiconductor dies 100. Furthermore, it is to be noted that for the term "above" with respect to the position of, for instance, the semiconductor layer 203 and the metallization system 210, the corresponding substrate surface or interface is to be taken as a reference. That is, the semiconductor layer 203 is formed "above" the front side 201F since these components are provided in close proximity to the "reference plane" 201F. Similarly, material layers may be formed above a rear side or back side 201B of the substrate 201, when the corresponding distance of any such materials is less compared to the distance to the front side 201F. For example, in some illustrative embodiments, a back side metallization 230 may be formed on or above the rear side 201B, which may comprise any appropriate material layers, as is also previously explained. In the above-defined sense, thus the back side metallization 230 is formed on or above the rear side 201B but not "above" the front side 201F.

The substrate 201 including the plurality of semiconductor dies 200 may be formed in accordance with any appropriate process strategy, as is, for instance, also described above with reference to the substrate 101 and the semiconductor dies 100. For example, circuit elements may be formed in and above the semiconductor layer 203 with critical dimensions of 100 nm and significantly less in sophisticated applications, while, in other cases, less critical semiconductor-based circuit elements may be provided. Similarly, the metallization system 210 may be formed on the basis of sophisticated dielectric materials, if required, possibly in combination with the contact elements 221 provided with an appropriate pitch in order to provide the input/output capabilities of sophisticated semiconductor devices. In other cases, the contact elements 221, for instance in the form of bond pads, may be restricted to the periphery of the individual semiconductor dies 200, as is also previously discussed. Similarly, the back side metallization layer 230 may be provided on the basis of any appropriate material system, as is also discussed above.

FIG. 2b schematically illustrates the substrate 201 in a further advanced manufacturing stage in which a sheet of material 240A, such as a flexible tape and the like, may be provided on or above the contact structure 220 so as to allow the attachment to any process tool for performing a separation process and also for providing superior integrity of the contact structure 220, for instance in view of contamination and the like. The sheet of material 240A may be applied on the basis of well-established process techniques, for instance by attaching a tape material and the like.

FIG. 2c schematically illustrates the substrate 201 during a first step of a process 290 for separating the semiconductor substrate 201 into individual semiconductor chips. As illustrated, during the process 290, trenches 205T may be formed in a portion of the substrate 201 from the rear side thereof, wherein, in some illustrative embodiments, appropriate cutting tools may be used comprising a saw blade 205 having an appropriate thickness so as to form the trenches 205T with a width 205W. The width 205W and thus the thickness of the saw blade 205 is selected such that a reliable cutting process may be achieved without undue chippage, while also the lifetime of the saw blade 205 may be within a desired acceptable range. In the embodiment shown in FIG. 2c, the process 290 may also require cutting through the back side metallization 230, which may result in the creation of metal debris, as also discussed above, wherein, however, the trenches 205T may not directly connect to the substrate front side 201F so that a direct front side contamination may be substantially avoided. Furthermore, the sheet of material 240A may also provide superior protection with respect to any undue front side contamination.

FIG. 2d schematically illustrates the substrate 201 in a further advanced manufacturing stage in which the sheet of material 240A (FIG. 2c) may be removed from the contact structure 220, which may be accomplished by any appropriate and well-established process technique, for instance for removing a tape material from a semiconductor substrate.

FIG. 2e schematically illustrates the substrate 201 according to some illustrative embodiments in which a cleaning process 207 or a sequence of cleaning processes may be applied, for instance on the basis of wet chemical etch chemistries, purging fluids and the like. For example, during the process 207, metal residues which may have been produced during the previous formation of the trenches 205T may be efficiently removed, for instance, by rinsing the substrate surface and/or using etch chemistries, performing a mechanical cleaning process, for instance using a scrubber, and the like. Consequently, the density of any metal residues may be significantly reduced prior to actually cutting through the entire substrate 201 in order to provide individual semiconductor chips.

FIG. 2f schematically illustrates the substrate 201 in a further advanced manufacturing stage in which a further sheet of material, such as a tape 240, may be formed above the rear side 201B, for instance on the back side metallization 230, if provided. To this end, any well-established process techniques may be applied.

FIG. 2g schematically illustrates the substrate 201 in a further advanced manufacturing stage. As illustrated, a second step of the separation process 290 may be performed in order to form further trenches 206T in the semiconductor dies 200 and in the remaining portion of the substrate 201 so as to connect to the previously formed trenches 205T. To this end, an appropriate cutting equipment may be used, for instance on the basis of a saw blade 206 having a thickness that produces a width 206W of the trenches 206T, which may be less than the width 205W of the previously formed trenches 205T. Consequently, in this case, a very efficient sawing process may be obtained due to the reduced width of the trenches 206T. On the other hand, undue chippage and reduced lifetime of the saw blades 206 may be less critical since only a portion of the substrate 201 has to be cut. The second step of the process 290 may be performed by using corresponding scribe lines 202Y and 202X, as will be described later on in more detail. As previously explained with reference to the substrate 101, the scribe lines 202Y, 202X may have to accommodate the width of the corresponding trenches to be formed therein so as to cut through the substrate 201. According to the principles disclosed herein, the width 206W may be selected significantly less compared to the width 205W, thereby also enabling a reduced width of the scribe lines 202Y, 202X. Consequently, in some illustrative embodiments as will be described later on in more detail, the scribe line width may be appropriately adapted to the width 206W of the trenches 206T and thus to the thickness of the saw blades in order to provide an increased usable surface area of the substrate 201.

It should be appreciated that any undue contamination of the contact structure 220 may be significantly less critical compared to conventional strategies since the critical process for cutting into the rear side has already been performed in a previous manufacturing stage, possibly in combination with additional cleaning processes.

Due to the provision of the trenches 206T, 205T with different widths, also the lateral dimensions of the substrate 201 may differ at the front side 201F and the rear side 201B. That is, a lateral dimension, indicated by 201V, at the rear side 201B may be less than the corresponding lateral dimension, indicated by 201W, at the front side 201F. It should be appreciated that the lateral dimension 201V may be greater in a corresponding width dimension, for instance in the horizontal direction of FIG. 2g, and also in a length direction, i.e., a direction perpendicular to the drawing plane of FIG. 2g. The same holds true for the lateral dimension 201W.

FIG. 2h schematically illustrates an individual semiconductor chip, which may also be indicated by the reference sign 200. That is, after the second step of the process 290 of FIG. 2g, the individual semiconductor chip 200 may be picked and may be subjected to further processing. As illustrated, the substrate 201 of the semiconductor chip 200 may have the different lateral dimensions 201W and 201V, as discussed above. Consequently, the further processing may be continued on the basis of the individual semiconductor chips 200 having the characteristic cross-sectional shape, i.e., the length and width, indicated by 201W, at the front side 201F is greater than the corresponding lateral dimension 201V at the rear side 201B of the substrate 201. Thereafter, the semiconductor chip 200 may be attached to any appropriate carrier or package substrate by means of the contact structure 220.

Figure 2I:
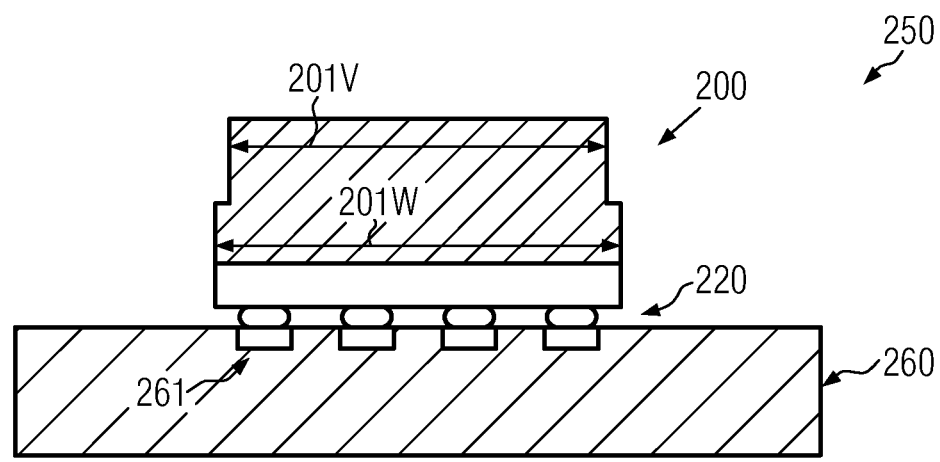
FIGS. 2a-2c schematically illustrate cross-sectional views of a semiconductor substrate comprising a plurality of semiconductor dies in a process sequence for forming trenches from the rear side of the substrate using an appropriate trench width, according to illustrative embodiments.
FIGS. 2d-2g schematically illustrate cross-sectional views of the substrate during various manufacturing stages in forming trenches of reduced width from the front side of the substrate so as to connect to the previously formed trenches and thus separate the substrate into individual semiconductor chips, according to illustrative embodiments.
FIG. 2h schematically illustrates an individual semiconductor chip whose substrate has a corresponding length and width obtained by the previous rear side/front side separation process, according to illustrative embodiments.
FIGS. 2l-2j schematically illustrate packaged semiconductor devices including semiconductor chips separated in accordance with process techniques described above.
FIG. 2k schematically illustrates a top view of the substrate including a plurality of semiconductor dies, which may be arranged with reduced lateral pitches due to the superior separation process, according to illustrative embodiments.

FIG. 2i schematically illustrates a "packaged" semiconductor device 250 comprising the semiconductor chip 200 and a package substrate 260. In the embodiment shown, the contact structure 220 may be directly connected to a complementary contact structure 261 of the package substrate 260, which may be accomplished by appropriate reflow processes, mechanical attachment and the like. As illustrated, the semiconductor chip 200 may have its characteristic cross-sectional shape defined by the different lateral dimensions 201W and 201V.

Figure 2J:
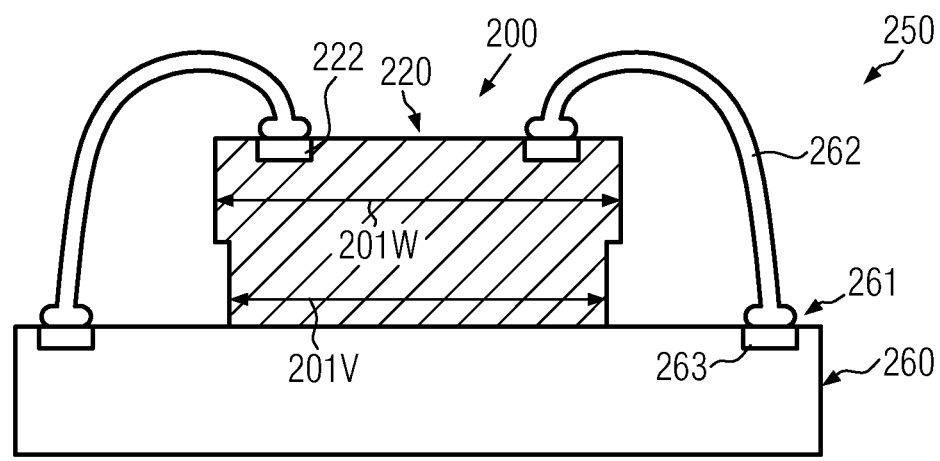

FIG. 2j schematically illustrates the packaged semiconductor device 250 according to further illustrative embodiments in which the semiconductor chip 200 may comprise the contact structure 220 so as to comprise bond pads 222 which may be electrically connected to a contact structure 261, i.e., to corresponding bond pads 263 of the package substrate 260 by means of bond wires 262. To this end, any appropriate wire bond technique may be applied. Also in this case, the semiconductor chip 200 may have its characteristic cross-sectional shape defined by the lateral dimensions 201W and 201V.

Figure 2K:
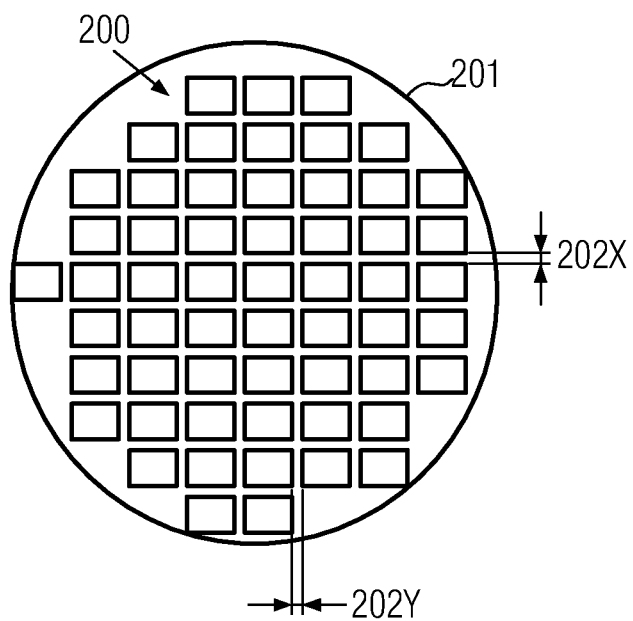

FIG. 2k schematically illustrates a top view of the substrate 201 in any manufacturing stage prior to separating the individual semiconductor dies 200 into semiconductor chips. As illustrated, the scribe lines 202Y and 202X may appropriately separate the individual semiconductor dies 200, wherein, in some illustrative embodiments, the width of the scribe lines 202X, 202Y is selected so as to comply with the reduced width of the corresponding trenches or the reduced thickness of the saw blade used for forming the trenches, as is previously discussed with reference to FIG. 2g. For example, the scribe line width may be selected identically for the "horizontal" scribe lines 202X and the "vertical" scribe lines 202Y, which may both be selected less than the scribe line width in conventional strategies.

It should be appreciated, however, that the width of the scribe lines 202X and 202Y may differ from each other, depending on the overall process requirements. Generally, for a given size and shape of the semiconductor dies 200, an increased number of dies may be provided on the substrate 201 for a given substrate diameter. For example, when comparing the substrate 101 as shown in FIG. 1 a with the substrate 201 as shown in FIG. 2k, the reduction in width of the scribe lines 202X and 202Y compared to the width of the scribe lines 102X and 102Y may result in a significant increase of the usable area related to the respective reduction in width of the scribe lines 202X, 202Y.

As a result, the present disclosure provides semiconductor devices and manufacturing techniques in which semiconductor substrates may be separated into individual semiconductor chips with superior area efficiency and/or with reduced front side contamination, for instance when complex back side metallizations have to be provided by sawing into the substrate from the back side thereof with a desired width of the resulting trenches, while finally the semiconductor chips may be separated by using a reduced thickness of the corresponding saw blades for cutting into the substrate from the front side thereof.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of separating a substrate comprising an array of semiconductor dies formed above a front side of said substrate, the method comprising:
    sawing into said substrate from a rear side thereof by using a first saw blade having a first thickness so as to form trenches; and
    sawing into said substrate from a front side thereof by using a second saw blade having a second thickness so as to connect to said trenches, said second thickness being less than said first thickness.

2. The method of claim 1, wherein sawing into said substrate from a front side thereof comprises sawing through a metallization system having a plurality of metal lines and vias.

3. The method of claim 1, wherein sawing into said substrate from a rear side thereof comprises sawing through one or more metal-containing material layers formed on said rear side.

4. The method of claim 1, further comprising providing a sheet of material above said front side prior to sawing into said substrate from a rear side thereof.

5. The method of claim 4, further comprising providing a further sheet of material above said rear side prior to sawing into said substrate from a front side thereof.

6. The method of claim 1, further comprising performing at least one cleaning process after forming said trenches and prior to sawing into said substrate from a front side thereof.

7. A method, comprising:
   forming an array of semiconductor dies above a front side of a substrate;
   separating said array into individual semiconductor chips by forming first trenches in a rear side of said substrate having a first width and subsequently forming second trenches having a second width in said front side so as to connect to said first trenches, said second width being less than said first width; and
   attaching a package substrate to each of at least some of said individual semiconductor chips.

8. The method of claim 7, wherein forming an array of semiconductor dies above said front side comprises forming semiconductor-based circuit elements and a metallization system above said front side.

9. The method of claim 8, wherein forming an array of semiconductor dies further comprises forming one or more metal-containing material layers on said rear side.

10. The method of claim 7, wherein forming said first and second trenches comprises sawing into said substrate from said rear side by using a first saw blade and sawing into said substrate from said front side by using a second saw blade.

11. The method of claim 7, wherein forming said first trenches comprises forming a removable sheet of material above said front side.

12. The method of claim 11, further comprising performing at least one cleaning process after removing said sheet of material and prior to forming said second trenches.

13. The method of claim 7, wherein attaching said package substrate comprises directly connecting a contact structure formed in each of said semiconductor chips to a complementary contact structure formed in said package substrate.

14. The method of claim 7, wherein forming an array of semiconductor dies comprises determining a minimal scribe line width that is compatible with a width of said first trenches and arranging said semiconductor dies by using a scribe line width that is less than said determined minimal scribe line width.

* * * * *